US010534230B2

(12) United States Patent
Choi

(10) Patent No.: US 10,534,230 B2
(45) Date of Patent: Jan. 14, 2020

(54) DISPLAY DEVICE HAVING IMPROVED DESIGN FOR POSITION AND SHAPE OF ELECTRICAL AND STRUCTURAL COMPONENTS

(71) Applicant: LG Display Co., Ltd., Seoul (KR)

(72) Inventor: Jae Yi Choi, Changwon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 13/945,788

(22) Filed: Jul. 18, 2013

(65) Prior Publication Data

US 2014/0139771 A1    May 22, 2014

(30) Foreign Application Priority Data

Nov. 19, 2012 (KR) .................. 10-2012-0131098

(51) Int. Cl.
| G02F 1/1345 | (2006.01) |
| G02F 1/1333 | (2006.01) |
| G02F 1/133 | (2006.01) |
| G02F 1/1368 | (2006.01) |

(52) U.S. Cl.
CPC .... G02F 1/13452 (2013.01); G02F 1/133305 (2013.01); *G02F 1/1368* (2013.01); *G02F 1/13306* (2013.01)

(58) Field of Classification Search
CPC .......................................... G02F 1/1345–13452
USPC ................. 349/58, 149–152, 158; 361/679.3
See application file for complete search history.

(56) References Cited

U.S. PATENT DOCUMENTS

| 6,618,111 | B1* | 9/2003 | Nagata et al. ............... 349/149 |
| 6,949,883 | B2* | 9/2005 | Matsueda ................ 315/169.3 |
| 8,253,883 | B2* | 8/2012 | Mimura ....................... 349/146 |
| 2002/0000961 | A1 | 1/2002 | Kang |
| 2002/0012079 | A1* | 1/2002 | Kim et al. ...................... 349/43 |
| 2002/0180686 | A1 | 12/2002 | Yuda et al. |
| 2003/0103027 | A1 | 6/2003 | Kim et al. |
| 2003/0201989 | A1* | 10/2003 | Kim et al. .................... 345/206 |
| 2004/0092137 | A1 | 5/2004 | Sakaki |
| 2007/0076159 | A1 | 4/2007 | Lee et al. |
| 2008/0164056 | A1 | 7/2008 | Gettemy et al. |
| 2010/0102719 | A1 | 4/2010 | Lee et al. |
| 2011/0007257 | A1* | 1/2011 | Min et al. ..................... 349/150 |
| 2011/0019351 | A1* | 1/2011 | Bayne et al. ............ 361/679.01 |
| 2011/0194063 | A1 | 8/2011 | Lee et al. |

(Continued)

FOREIGN PATENT DOCUMENTS

| CN | 1877397 A | 12/2006 |
| CN | 102046900 A | 5/2011 |

(Continued)

*Primary Examiner* — Dung T Nguyen
(74) *Attorney, Agent, or Firm* — Birch, Stewart, Kolasch & Birch, LLP

(57) ABSTRACT

Discussed is a display device with an improved aesthetic design. The display device according to an embodiment includes a display panel configured to include a first substrate, which includes an active area including a plurality of pixels and an inactive area except the active area, and a second substrate facing-coupled to the first substrate. The first substrate includes a first rounding portion formed at each of corner portions thereof to have a first curvature, and the active area includes a second rounding portion formed at each of corner portions thereof to have a second curvature.

19 Claims, 17 Drawing Sheets

(56) References Cited

U.S. PATENT DOCUMENTS

| | | | |
|---|---|---|---|
| 2012/0194494 A1 | 8/2012 | Jung et al. | |
| 2012/0281344 A1 | 11/2012 | Weber et al. | |
| 2012/0320329 A1* | 12/2012 | Lee et al. | 349/158 |
| 2013/0342429 A1* | 12/2013 | Choi | H05K 13/00 345/30 |

FOREIGN PATENT DOCUMENTS

| | | |
|---|---|---|
| JP | 7-49657 A | 2/1995 |
| JP | 2002-311850 A | 10/2002 |
| JP | 2003-186044 A | 7/2003 |
| JP | 2005-235452 A | 9/2005 |
| KR | 2001-0009044 A | 2/2001 |
| KR | 10-2010-0047585 A | 5/2010 |
| KR | 10-2012-0088220 A | 8/2012 |
| WO | WO 2009/123696 A2 | 10/2009 |

\* cited by examiner

DISPLAY DEVICE HAVING IMPROVED DESIGN FOR POSITION AND SHAPE OF ELECTRICAL AND STRUCTURAL COMPONENTS

CROSS-REFERENCE TO RELATED APPLICATIONS

This application claims the benefit of the Korean Patent Application No. 10-2012-0131098 filed on Nov. 19, 2012, which is hereby incorporated by reference as if fully set forth herein.

BACKGROUND

Field of the Invention

The present invention relates to a display device.

Discussion of the Related Art

Recently, with the advance of multimedia, display devices are increasing in importance. Therefore, flat panel display (FPD) devices, such as liquid crystal display (LCD) devices, plasma display panels (PDPs), organic light emitting display devices, etc., are being commercialized. Among such FPD devices, the LCD devices and the organic light emitting display devices have excellent characteristics such as thinning, lightening, low power consumption, etc., and thus are being widely used as display devices for notebook computers, televisions, tablet computers, monitors, smart phones, portable display devices, portable information devices, etc.

Display manufacturers enhanced the resolution, image quality, power consumption, etc. of display devices to induce users (or consumers) to buy products, but, recently, research and development for enhancing design of display devices are being done for actively appealing for an aesthetic design sense of consumers to lead to a purchase. For example, general display devices have an enhanced aesthetic design appearance due to a rectangular outer case having a plurality of rounded corner portions.

Recently, as illustrated in FIG. 1, a display device with an aesthetic design, which is more improved by rounding corner portions 2a of an outer case 2 so as to have a greater curvature, is being commercialized.

However, as seen in FIG. 1, in the display device, each of the corner portions 2a of the outer case 2 has a curvature due to rounding, but, corner portions 1a of an active area AA of a display panel 1 are formed rectangularly. Therefore, the corner portions 1a of the active area AA of the display panel 1 and the corner portions 2a of the outer case 2 are formed to have different angular shapes, and this disharmonious aesthetic design can act as an obstacle in inducing consumers to buy products.

SUMMARY

Accordingly, the present invention is directed to provide a display device that substantially obviates one or more problems due to limitations and disadvantages of the related art.

An aspect of the present invention is directed to provide a display device with an improved design for the position, shape, and interconnection of electrical and structural components in the display device.

Another aspect of the present invention is directed to provide a display device that can prevent an image quality from being degraded due to a deviation of data signals, and have a reduced bezel width.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a display device including a display panel configured to include a first substrate, which includes an active area including a plurality of pixels and an inactive area except the active area, and a second substrate facing-coupled to the first substrate, wherein the first substrate includes a first rounding portion formed at each of corner portions thereof to have a first curvature, and the active area includes a second rounding portion formed at each of corner portions thereof to have a second curvature.

The display device may further include an outer case configured to surround an area other than the active area of the display panel, each of corner portions of the outer case being rounded. In this case, each corner portion of the outer case may be rounded to have a curvature parallel to the first curvature.

The display device may further include: a plurality of data drivers configured to convert input pixel data into data signals according to a data control signal to supply the data signals to the respective pixels; a gate driver configured to generate a gate pulse according to a gate control signal to supply the gate pulse to the pixels; and a gate control signal supplier configured to supply the gate control signal to the gate driver. In this case, the first substrate may include: a plurality of data lines and a plurality of gate lines formed to intersect in the active area, and connected to the pixels; and a plurality of gate control signal pad parts disposed in the inactive area between the first rounding portion and a corresponding gate pad part, connected to the respective gate control signal suppliers, and connected to the gate control signal input pad of a gate pad part adjacent thereto.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
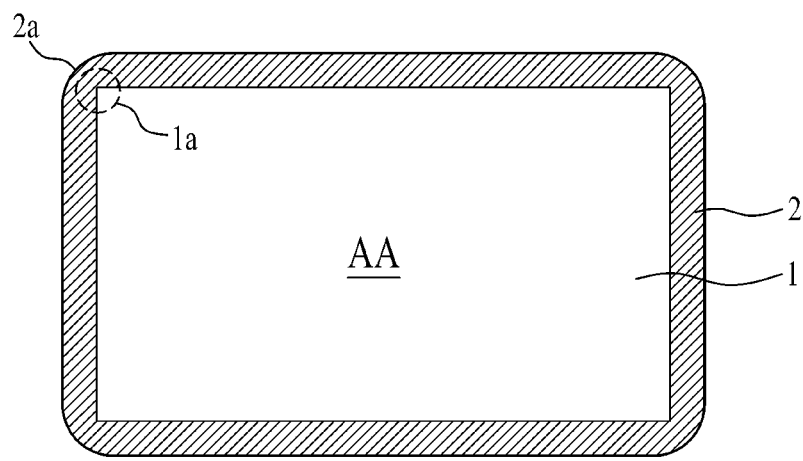
FIG. 1 is a view for describing a related art display device.

In the specification, in adding reference numerals for elements in each drawing, it should be noted that like reference numerals already used to denote like elements in other drawings are used for elements wherever possible.

The terms described in the specification should be understood as follows.

As used herein, the singular forms "a", "an" and "the" are intended to include the plural forms as well, unless the context clearly indicates otherwise. The terms "first" and "second" are for differentiating one element from the other element, and these elements should not be limited by these terms.

It will be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Hereinafter, embodiments of a display device according to the present invention will be described in detail with reference to the accompanying drawings. The embodiments described in the remainder of the disclosure illustrate representative positions of the gate control signal pad parts GCPP. These embodiments are not meant to be exhaustive and other positions of the gate control signal pad parts GCPP although not explicitly described are included within the scope of the present invention.

Figure 2:
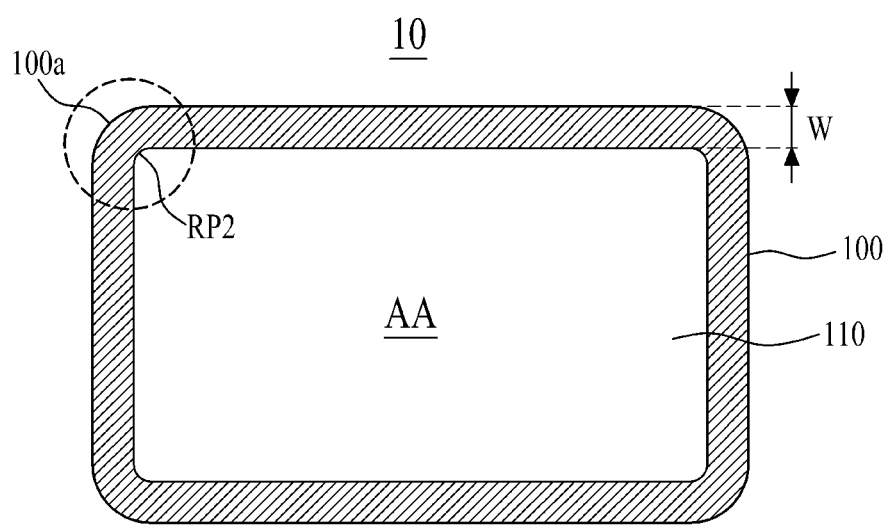
FIGS. 2 and 3 are views for describing a display device according to a first embodiment of the present invention.
Figure 3:
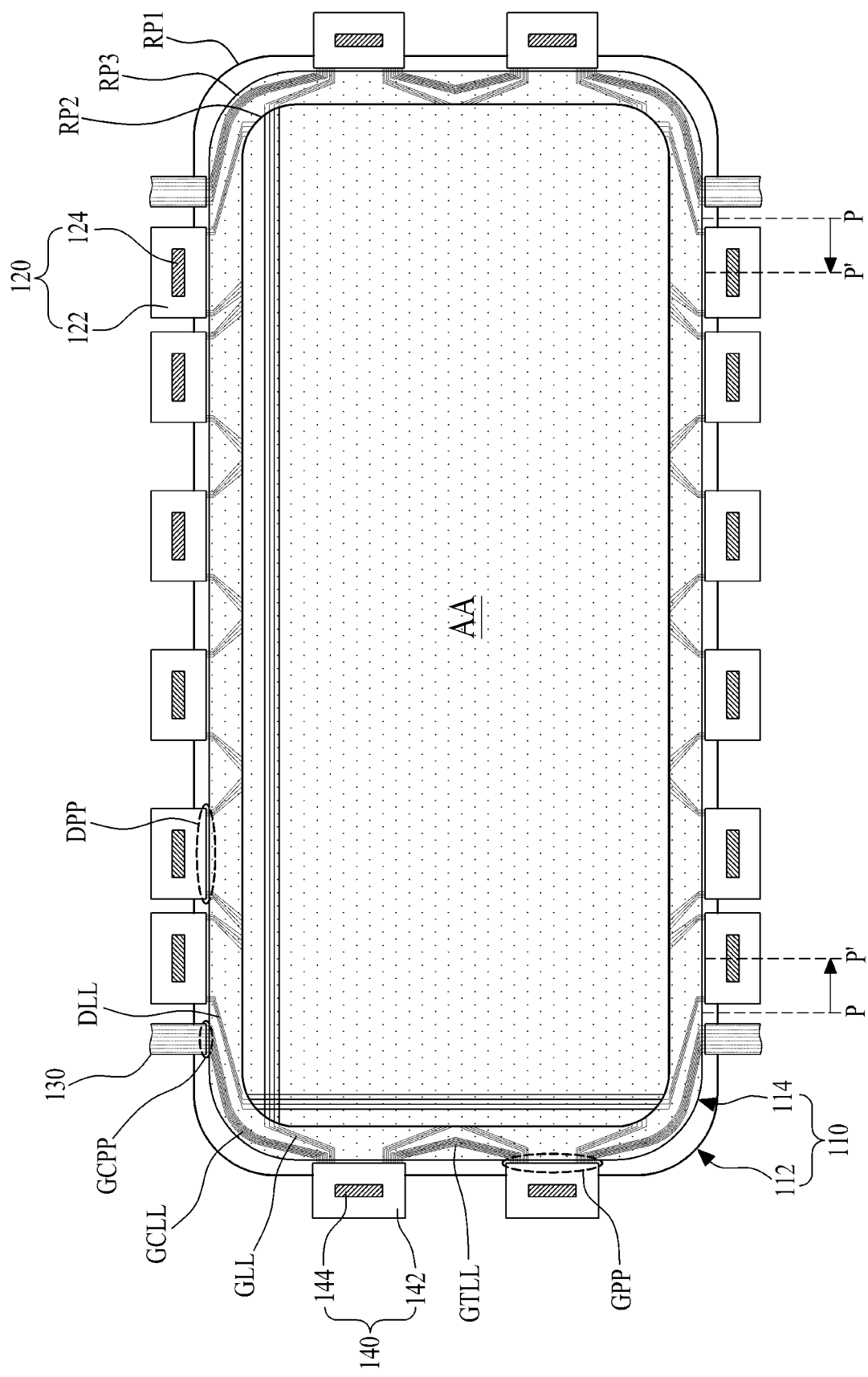

FIGS. 2 and 3 are views for describing a display device according to a first embodiment of the present invention.

Referring to FIGS. 2 and 3, a display device 10 according to a first embodiment of the present invention includes a display panel 110, a data driver 120, a gate control signal supplier 130, and a gate driver 140.

The display panel 110 includes first and second substrates 112 and 114 facing-coupled to each other. The display panel 110 may be a liquid crystal display panel, which displays an image by using a light-transmitting characteristic of liquid crystal, or an organic light emitting display panel that displays an image by using a light-transmitting characteristic of an organic light emitting element. In the following description, for convenience of description, the display panel 110 is assumed as the organic light emitting display panel.

The first substrate 112 may be formed of a transparent glass material or a transparent plastic material. The first substrate 112 includes a first rounding portion RP1, an active area AA that includes a plurality of pixels for displaying a certain image, and an inactive area provided near the active area AA.

The first rounding portion RP1 is formed at each of corner portions of the first substrate 112 to have a first curvature having a radius of several mm to several tens mm, for improving an aesthetic design of the display device 10. The first rounding portion RP1 may be formed by a mechanical cutting process or a polishing process, or formed the polishing process after a cutting process using a laser.

The active area AA may be defined as an area other than upper, lower, left, and right edge portions of the first substrate 112. The active area AA includes a second rounding portion RP2 formed at each corner portion of the active area AA.

The second rounding portion RP2 is formed at each of corner portions of the active area AA to have a second curvature having a radius of several mm to several tens mm, for improving an aesthetic design of the active area AA. In this case, the second curvature of the second rounding portion RP2 may be preferably set in harmony with and in parallel to the first curvature of the first rounding portion RP1, but, since the second curvature may be changed depending on a design of the display device 10, the second curvature is not necessarily required to be in parallel to the first curvature.

The above-described first rounding portion RP1 is covered by an outer case 100, but corner portions 100a of the outer case 100 covering the first rounding portion RP1 are rounded on the basis of the first curvature of the first rounding portion RP1 of the first substrate 112, for improving an aesthetic design of the display device 10. The second rounding portion RP2 of the active area AA is exposed to a front without being covered by the outer case 100. Therefore, when seen from the outside of the display device 10, a rounding curvature formed at each of the corner portions 100a of the outer case 100 may be in harmony with the second rounding portion RP2 of the active area AA, thus more improving the aesthetic design of the display device 10. Accordingly, the rounding curvature formed at each corner portion 100a of the outer case 100 may be in parallel to the first curvature of the first rounding portion RP1 and the second curvature of the second rounding portion RP2, for improving the aesthetic design of the display device 10, but the rounding curvature is not necessarily required to be in parallel to the first and second curvatures.

In the active area AA, a plurality of pixels are formed in a matrix type to include at least one thin film transistor (TFT) by a TFT forming process.

The respective pixels are formed in a plurality of pixel areas defined by a plurality of data lines and a plurality of gate lines which are formed to intersect in the first substrate 112. Each of the pixels emits light with a current flowing between first and second driving power sources by a data signal supplied to a corresponding data line according to at least one gate pulse supplied to at least one gate line, thereby displaying an image. To this end, each pixel includes: a pixel circuit (not shown) that stores the data signal in response to the at least one gate pulse, and includes at least two TFTs and at least one capacitor for outputting a current corresponding to a stored voltage on the basis of the first driving power source; and an organic light emitting element that is connected between the pixel circuit and the second driving power source, and emits light in proportion to a current flowing between the pixel circuit and the second driving power source.

The inactive area may be defined by the upper, lower, left, and right edge portions of the first substrate 112. The inactive area includes a plurality of data pad parts DPP, a plurality of gate control signal pad parts GCPP, and a plurality of gate pad parts GPP, which are formed simultaneously with a process of forming the TFT of each pixel.

Each of the plurality of data pad parts DPP includes a plurality of data pads that are arranged at certain intervals in each of upper and lower inactive areas of the first substrate 112. Each of the plurality of data pads is connected to a corresponding data line through a data link line DLL. A plurality of the data link lines DLL are provided in the inactive area between the data pad part DPP and the active area AA, and have a certain slope according to positions (or distance) of a data pad and a data line to be connected to each other.

Each of the plurality of gate control signal pad parts GCPP includes a plurality of gate control signal supply pads which are arranged in each of the upper and lower inactive areas of the first substrate 112 to be adjacent to the data pad part DPP and the first rounding portion RP1 of the first substrate 112. Each of the plurality of gate control signal supply pads is linked to a corresponding gate pad part through a gate control signal link line GCLL. The gate control signal link line GCLL is disposed adjacently to the first rounding portion RP1 of the first substrate 112, and provided in a straight line and curve shape between the first rounding portion RP1 of the first substrate 112 and the second rounding portion RP2 of the active area AA.

Each of the plurality of gate pad parts GPP includes a plurality of gate pads, a plurality of gate control signal input pads, and a plurality of gate control signal output pads, which are arranged at certain intervals in the inactive area of each of left and right edge portions of the first substrate 112.

Each of the plurality of gate pad parts is linked to a corresponding gate line through a gate link line GLL. A plurality of the gate link lines GLL are provided in the inactive area between the gate pad part GPP and the active area AA, and have a certain slope according to positions (or distance) of a gate pad and a gate line to be connected to each other.

Each of the plurality of gate control signal input pads is connected to the gate control signal link line GCLL, and each of the plurality of gate control signal output pads is connected to a gate control signal input pad of a next gate pad part GPP through a gate control signal transfer line GTLL. Therefore, among the plurality of gate pad parts GPP, each of first and last gate pad parts GPP respectively connected to first and last gate lines is connected to the gate control signal pad part GCPP through a gate control signal link line GCLL.

The second substrate 114 overall covers an area other than the data pad parts DPP, gate control signal pad parts GCPP, and gate pad parts GPP of the first substrate 112, like a dot hatching area of FIG. 3. The second substrate 114 may be formed of a transparent glass material, a transparent plastic material, or an opaque metal material in a flat shape, and may have a protrusion portion overlapping the active area AA.

The second substrate 114 includes a third rounding portion RP3. The third rounding portion RP3 is formed at each of corner portions of the second substrate 114 to have a third curvature having a radius of several mm to several tens mm. The third rounding portion RP3 is disposed between the first rounding portion RP1 of the first substrate 112 and the second rounding portion RP2 of the active area AA, and, for the same reason as the above-described aesthetic design, the third curvature of the third rounding portion RP3 may be set to be in parallel to the first and second curvatures of the respective first and second rounding portions RP1 and RP2.

The first and second substrates 112 and 114 are facing-coupled to each other by a sealing member. Here, the sealing member couples a bottom edge portion of the second substrate 114 to the inactive area of the first substrate 112, thus protecting the organic light emitting element of each pixel formed in the active area AA against moisture or oxygen.

The data driver 120 is connected to the plurality of data pad parts DPP disposed in the first substrate 112, and simultaneously supplies data signals to both sides of each data line through the data pad and the data link line DLL. To this end, the data driver 120 includes a plurality of data flexible circuit films 122 and a plurality of data driving integrated circuits (ICs) 122.

Each of the plurality of data flexible circuit films 122 is adhered to a corresponding data pad part DPP disposed in the first substrate 112. Each of the plurality of data flexible circuit films 122 may be formed as a tape carrier package (TCP) or a chip on film (chip on flexible board, COF), and adhered to a corresponding data pad part DPP by a tape automated bonding (TAB) process.

Each of the plurality of data driving ICs 124 is mounted on the first flexible circuit film 122. Each of the plurality of data driving ICs 124 converts pixel data into analog data signals by using pixel data, a data control signal, and a plurality of reference gamma voltages which are inputted from an external printed circuit substrate (PCB, not shown) through the first flexible circuit film 122, and supplies the converted data signals to corresponding data lines through the first flexible circuit film 122 and the respective data pads and data link lines DLL of the data pad part DPP.

The gate control signal supplier 130 is configured with an assistant flexible circuit film which is adhered by the TAB process to the gate control signal pad part GCPP disposed in the first substrate 112. The assistant flexible circuit film supplies the gate control signal, supplied from the external PCB, to the gate control signal supply pad, and thus allows the gate controls signal to be supplied to the gate pad part GPP through the gate control signal supply pad and the gate control signal link line GCLL. To this end, a plurality of gate control signal supply lines corresponding to the gate control signal are disposed in the assistant flexible circuit film.

The gate driver 140 is connected to the plurality of gate pad parts GPP disposed in the first substrate 112, and simultaneously supplies the gate pulse to both sides of each gate line through the gate pad and the gate link line GLL. To this end, the gate driver 140 includes a plurality of gate flexible circuit films 142 and a plurality of gate driving ICs 134.

Each of the plurality of gate flexible circuit films 142 is adhered to a corresponding gate pad part GPP disposed in the first substrate 112. Each of the plurality of gate flexible circuit films 142 may be formed as the TCP or the COF, and adhered to a corresponding gate pad part GPP by the TAB process.

Each of the plurality of gate driving ICs 144 is mounted on the gate flexible circuit film 142. Each of the plurality of gate driving ICs 144 sequentially generates the gate pulse according to a gate control signal which is supplied from each gate control signal input pad of the gate pad part GPP through the gate flexible circuit film 142, and supplies the generated gate pulse to a corresponding gate line through the gate flexible circuit film 142, the gate pad, and the gate link line GLL. Here, the gate control signal may include a gate start pulse, a plurality of clock signals, driving power, and the gate output signal. Each of the plurality of gate driving ICs 144 may be configured with a shift register that sequentially outputs the gate pulse according to the gate controls signal.

In FIG. 3, it is illustrated that the plurality of data pad parts DPP are disposed in the upper and lower inactive areas of the display panel 110, and the plurality of gate pad parts GPP are disposed in the left and right inactive areas of the display panel 110, but is not limited thereto. As another example, the plurality of data pad parts DPP may be disposed in only the upper or lower inactive area of the display panel 110, and the plurality of gate pad parts GPP may be disposed in only the left or right inactive area of the display panel 110. Also, the numbers and positions of data drivers 120, gate drivers 140, and gate control signal suppliers 130 may be changed to correspond to the positions of the data pad parts DPP and gate pad parts GPP.

In the display device 10 according to the first embodiment of the present invention, the rounding portions RP1 and RP2 are formed at each corner edge of the display panel 110, and specifically, at each corner portion of the first substrate 112 and each corner portion of the active area AA. The outer case 100 having the rounded corner portions surrounds an area other than the active area AA of the display panel 110, and thus, as illustrated in FIG. 2, the rounded corner portion 100a of the outer case 100 is harmonized with the rounding portion RP2 of the active area AA, thereby improving an aesthetic design.

However, according to the first embodiment of the present invention, an image quality of areas corresponding to the data lines respectively connected to the first and last data pad parts DPP of the plurality of data pad parts DPP is lower than the other area, and a bezel width W of the outer case 200 increases compared to the related art.

Specifically, in the display device 10 according to the first embodiment of the present invention, since the first rounding portion RP1 is formed at each corner portion of the first substrate 110 and the gate control signal pad part GCPP is disposed adjacently to the first rounding portion RP1, the first and last data pad parts DPP of the plurality of data pad parts DPP respectively connected to first and last data lines are moved to and disposed at a central portion of a long side of the first substrate 112 due to the rounding portion RP1 and the gate control signal pad part GCPP. In detail, several hundreds of the plurality of data lines are configured into one data block, and the data lines of each data block are connected to one data pad part DPP. Therefore, a central portion of each data pad part DPP may be disposed to correspond to a central portion of a corresponding data block, and the data link lines DLL may be disposed to be laterally symmetrical about a central portion of a corresponding data pad part DPP.

Each of the first and last data pad parts DPP of the display device 10 according to the first embodiment of the present invention is not disposed at a reference position P (which is the central portion of the data block) due to the first rounding portion RP1 and the gate control signal pad part GCPP, and is disposed at a position P' which is moved by a certain distance to the central portion of the long side of the first substrate 112 close to one side of the data block. Therefore, the pads of each of the first and last data pad parts DPP and a corresponding data link line DLL connecting data lines corresponding to the pads are disposed to be asymmetrical about the central portion of the data pad part DPP, and thus, a voltage drop deviation of data signals is caused by a line resistance deviation of data link lines DLL, causing a degradation of an image quality.

Furthermore, because, in the first embodiment in the present invention, the data link lines DLL are disposed in an asymmetrical structure, among the data link lines DLL that connect the respective data pads of the first and last data pad parts DPP to corresponding data lines, data link lines DLL adjacent to the left side and right side of the first substrate 112 are enlarged in length, and thus, a width between the data pad part DPP and the active area AA increases, causing an increase in the bezel width of the outer case 100.

Figure 4:
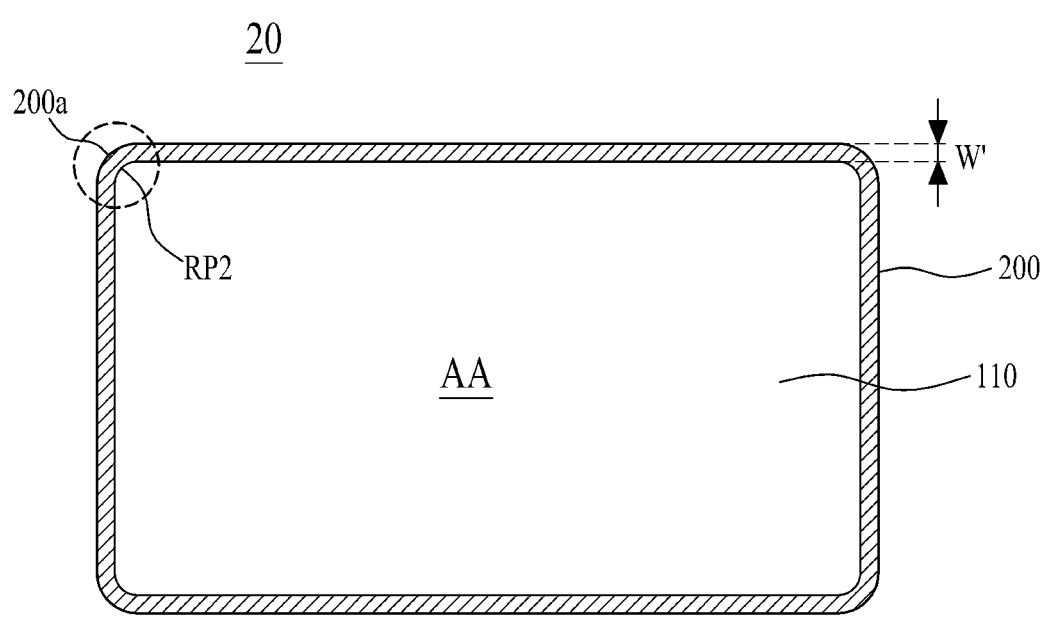
FIGS. 4 and 5 are views for describing a display device according to a second embodiment of the present invention.
Figure 5:
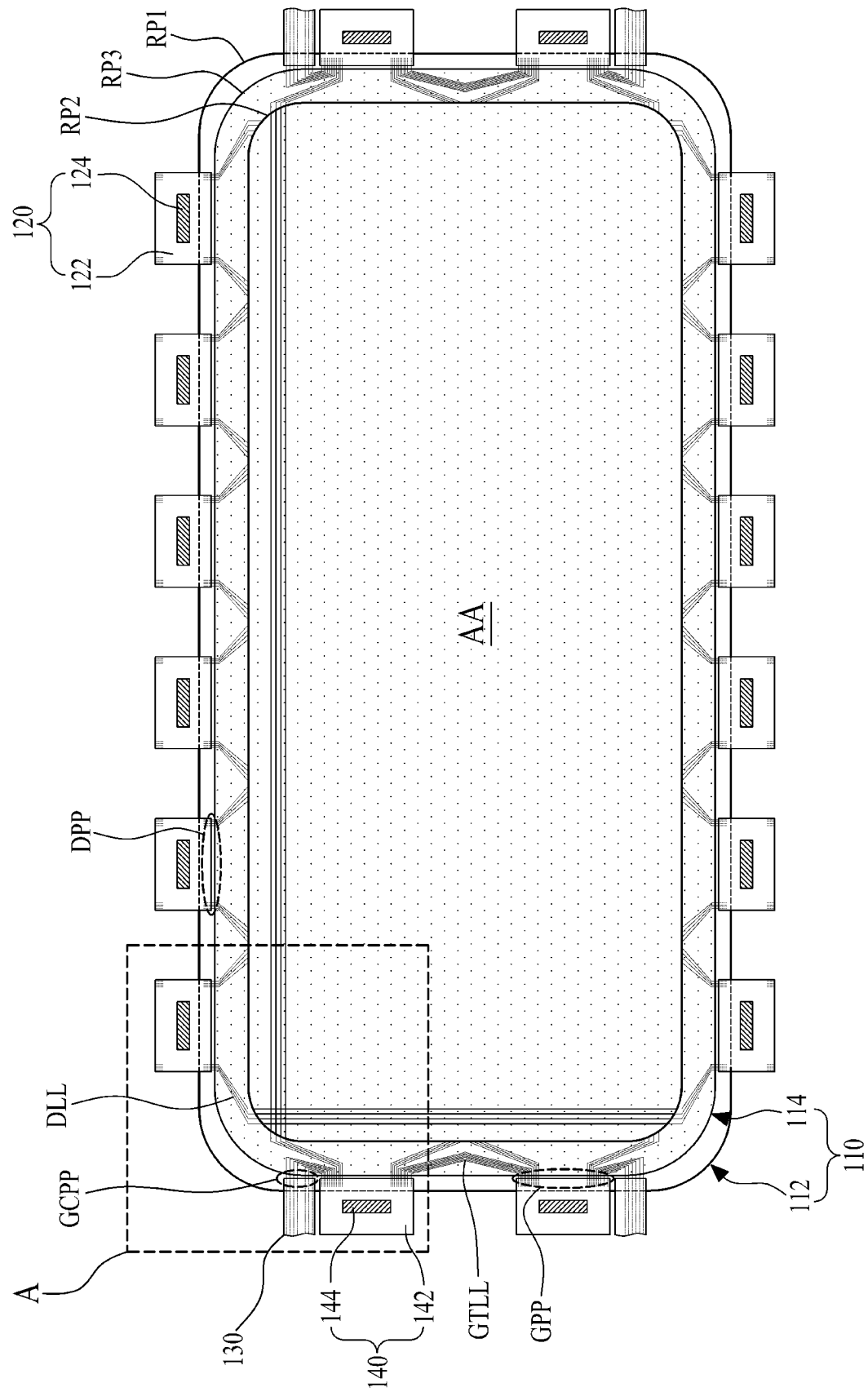
Figure 6:
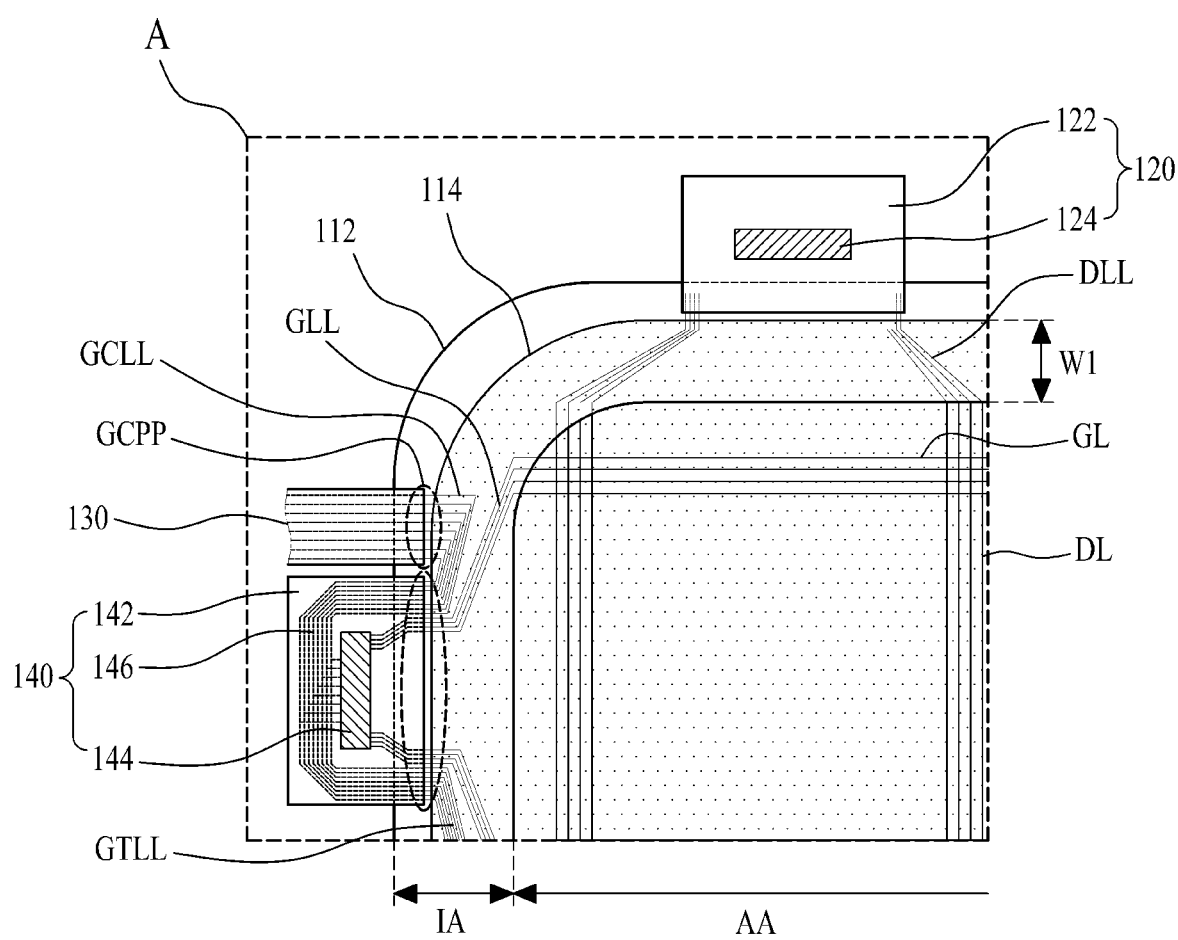
FIG. 6 is an enlarged view illustrating an A portion of FIG. 5.

FIGS. 4 and 5 are views for describing a display device according to a second embodiment of the present invention including a different portion for the gate control signal pad parts GCPP, and FIG. 6 is an enlarged view illustrating an A portion of FIG. 5.

As seen in FIGS. 5 and 6, in a display device 20 according to the second embodiment of the present invention, a display panel 110 is configured identically to the display panel 110 of FIG. 3, the plurality of gate control signal pad parts GCPP are respectively disposed in left and right inactive areas IA of the display panel 110. That is, as in the above-described first embodiment, the left and right inactive areas IA of the display panel 110 are areas in which a plurality of gate pad parts GPP are disposed, and relatively have a spare space unlike left and right inactive areas IA of the display panel 110 in which a plurality of data pad parts DPP are respectively disposed. Accordingly, in the display device 20 according to the second embodiment of the present invention, the plurality of gate control signal pad parts GCPP are respectively disposed in the left and right inactive areas IA of the display panel 110 having the spare space, and thus can decrease a degradation of an image quality caused by the above-described first embodiment and can more reduce a bezel width W' of an outer case 200.

Specifically, the plurality of gate control signal pad parts GCPP are respectively disposed at an upper side and left side of each of the left and right inactive areas IA of the first substrate 112 adjacently to the above-described first rounding portion RP1 of the first substrate 112. That is, the gate control signal pad part GCPP is disposed between the first rounding portion RP1 and each of the first and last gate pad parts of the plurality of gate pad parts GPP respectively connected to the first and last gate lines.

Each of the plurality of gate control signal pad parts GCPP includes a plurality of gate control signal supply pads electrically connected to the above-described gate control signal supplier 130. The plurality of gate control signal supply pads are connected to the gate control signal input pad of the gate pad part GPP through the gate control signal link line GCLL disposed between the gate control signal pad part GCPP and the gate link line GLL.

The gate control signal, supplied from the gate control signal supplier 130 to the gate control signal pad part GCPP, is supplied to the gate driving IC 144 of the gate driver 140 through the gate control signal supply pad, the gate control signal link line GCLL, the gate control signal input pad of the gate pad part GPP, and the gate flexible circuit film 142 of the gate driver 140. The gate control signal supplied to the gate flexible circuit film 142 is supplied to the gate control signal output pad and gate control signal transfer line GTLL of the gate pad part GPP through an internal line provided in the gate flexible circuit film 142, and then supplied to a next gate driving IC 144 through a gate control signal input pad of a next gate pad part GPP and a next gate flexible circuit film 142. Therefore, the gate driving IC 144 generates the gate pulse on the basis of the gate control signal supplied to the gate control signal pad part GCPP, and sequentially supplies the gate pulse to a plurality of gate lines GL.

As described above, since the plurality of gate control signal pad parts GCPP are respectively disposed in the left and right inactive areas IA of the display panel 110, each of central portions of the first and last data pad parts DPP of the plurality of data pad parts DPP respectively disposed in the upper and lower inactive areas IA of the first substrate 112 may be disposed at a central portion of a corresponding data block, or disposed at a portion closest to the central portion of the corresponding data block. Therefore, data link lines DLL that connect respective data pads of the first and last data pad parts DPP to corresponding data lines DL may be provided to have the best possible symmetrical structure with respect to the central portion of the data pad DPP, and therefore, a length deviation of data link lines DLL is minimized, thus minimizing a width W1 between the data pad part DPP and the active area AA.

Figure 7:
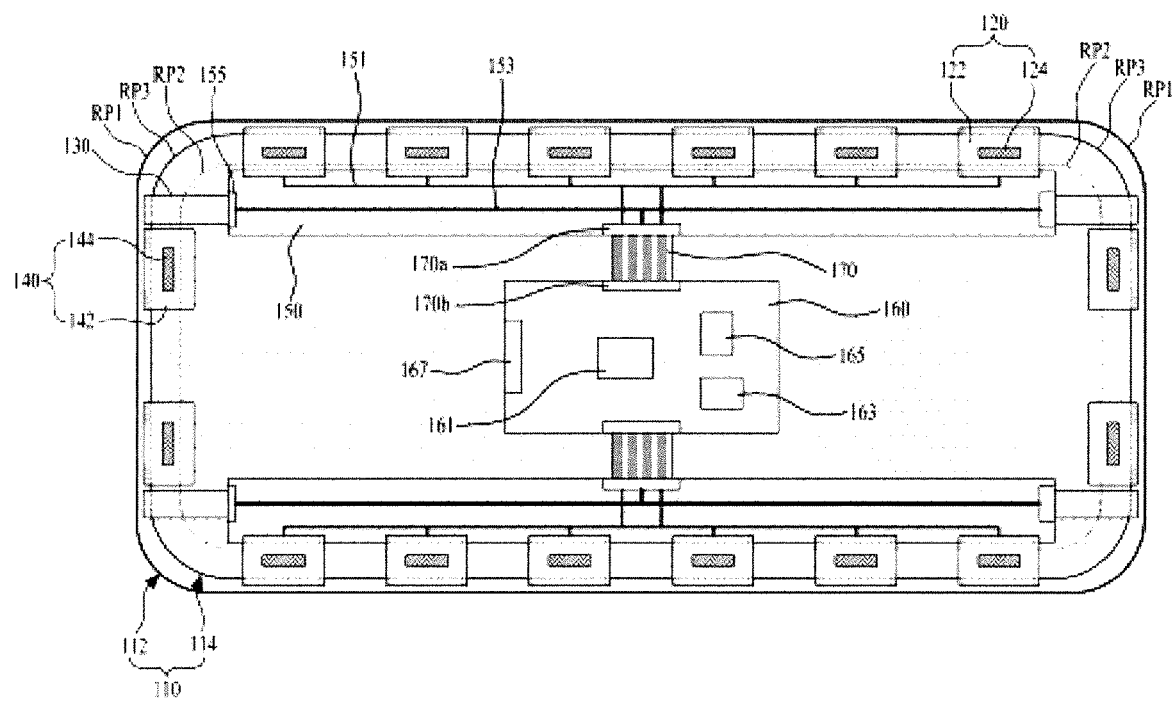
FIG. 7 is a rear view for describing the display device according to the second embodiment of the present invention.

The above-described display device 20 according to the second embodiment of the present invention, as illustrated in FIG. 7, may further include a printed circuit board (PCB) 150, a control board 160, and a signal transfer member 170.

The PCB 150 is connected to the plurality of data drivers 120 in common, and connected to the gate control signal supplier 130. That is, the PCB 150 is electrically connected to the data flexible circuit film 122 of each of the plurality of data drivers 120 by the TAB process, and electrically connected to the assistant flexible circuit film (which is the gate controls signal supplier 130) by a connector connection scheme.

A plurality of data signal transfer lines 151 for transferring pixel data, the plurality of reference gamma voltages, and various driving powers, which are supplied from the control board 160, to the data driving IC 124 of each of the plurality of data drivers 120 are disposed in the PCB 150, and a plurality of gate signal transfer lines 153 for transferring the gate control signal and various driving powers, which are supplied from the control board, to the gate control signal supplier 130 are disposed in the PCB 150. Also, a first connector 155, electrically connected to the assistant flexible circuit film 130 that is the gate control signal supplier 130, is mounted on the PCB 150.

The first connector 155 is electrically connected to the assistant flexible circuit film 130, and transfers the gate control signal and various driving powers, which are supplied to the gate signal transfer lines 153, to the assistant flexible circuit film 130.

Figure 8:
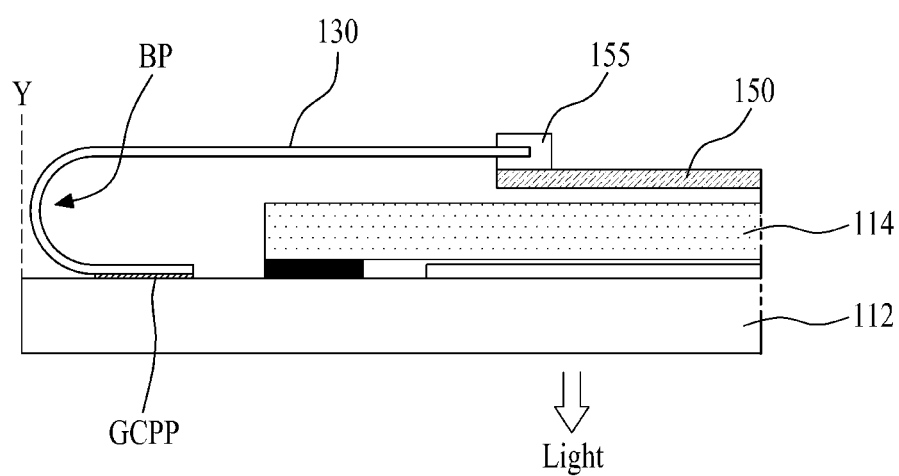
FIG. 8 is a sectional view for describing a disposition structure of a gate control signal supplier of FIG. 7.

The assistant flexible circuit film 130, as illustrated in FIG. 8, is adhered to the gate control signal pad part GCPP of the first substrate 112 by the TAB process, and is not bent to surround a side surface of the first substrate 112 but is bent in a top direction of the second substrate 114 and connected to the first connector 155. In this case, a bending portion BP of the assistant flexible circuit film 130 is disposed inside the side surface of the first substrate 112 without protruding to outside the side surface of the first substrate 112. Therefore, since the assistant flexible circuit film 130 does not protrude to outside the side surface of the first substrate 112, a side bezel width of the display device can be reduced. The bending structure of the assistant flexible circuit film 130 is a structure in which image light emitted from the active area of the display panel 110 is not irradiated in a front direction of the second substrate 114 but travels in a rear direction of the first substrate 112. However, when the image light emitted from the active area of the display panel 110 is irradiated in the front direction of the second substrate 114, the assistant flexible circuit film 130 is bent to surround the side surface of the first substrate 112, and disposed at a rear surface of the first substrate 112. The bending structure of the assistant flexible circuit film 130 may also be identically applied to the data flexible circuit film 122 and the gate flexible circuit film 142.

Figure 9:
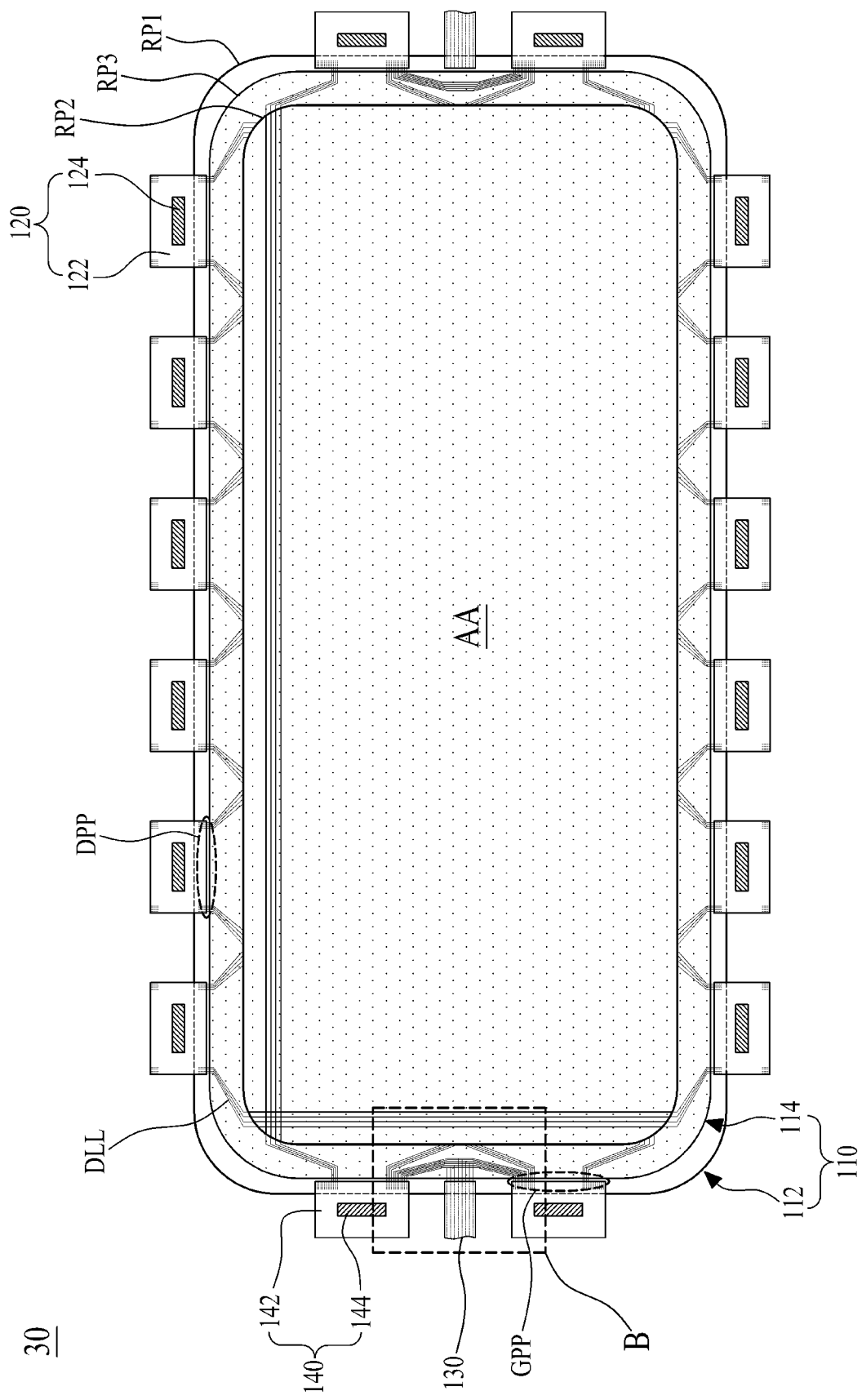
FIGS. 9 and 10 are views for describing a display device according to a third embodiment of the present invention.
Figure 10:
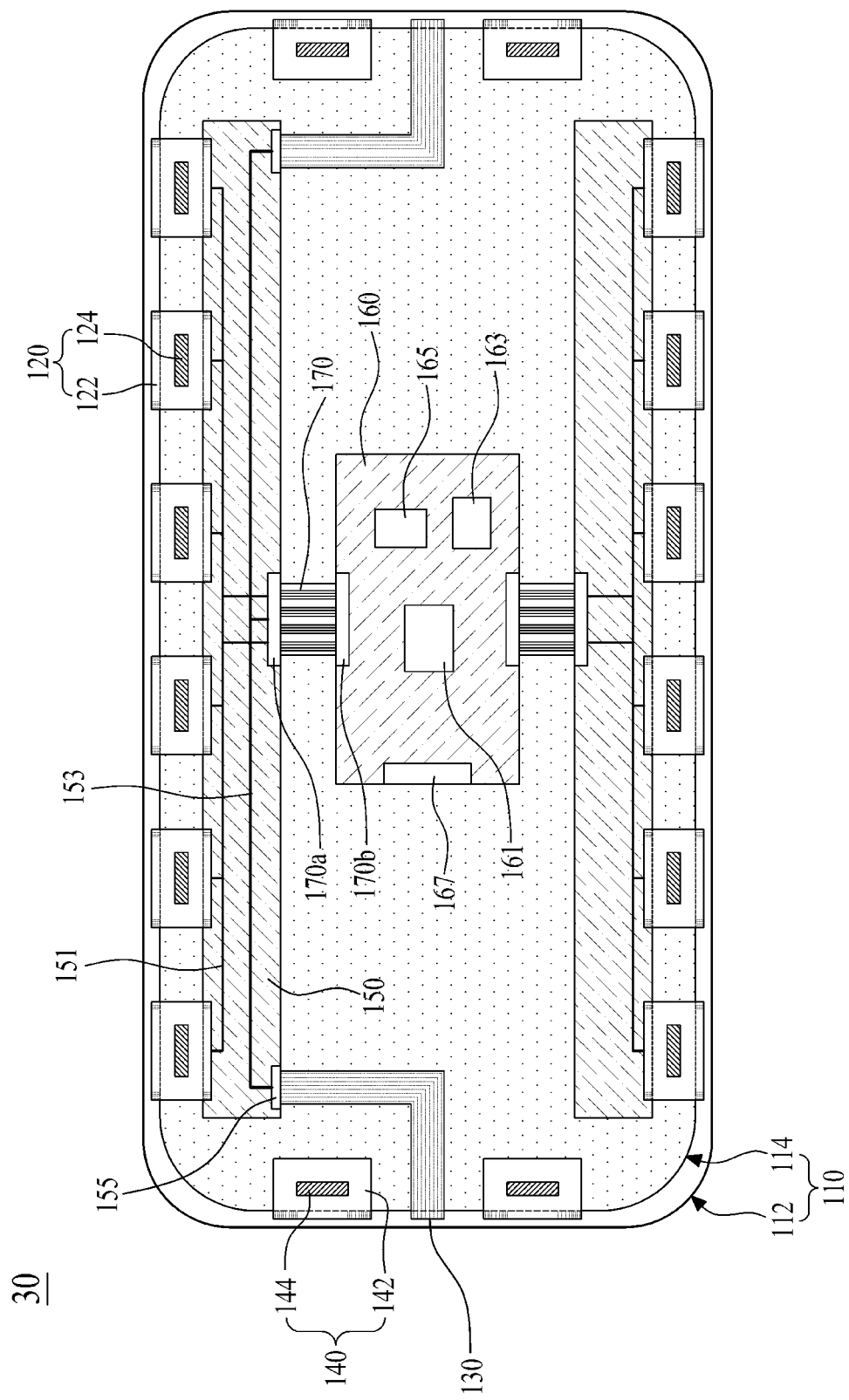
Figure 11:
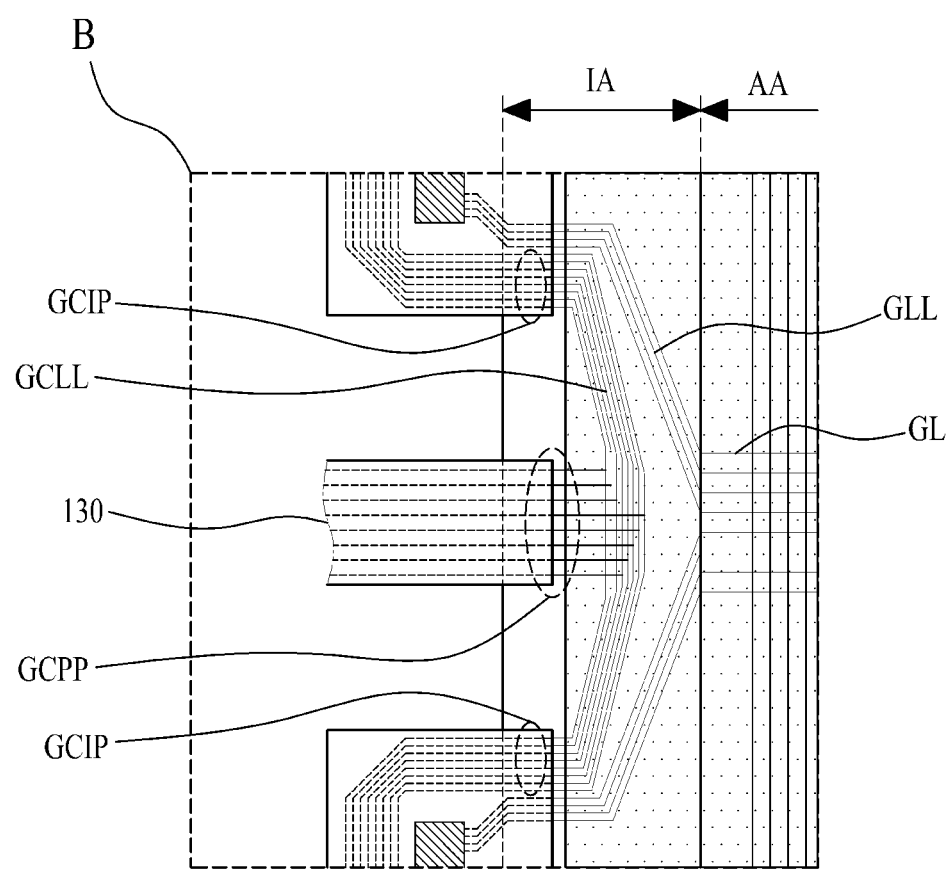
FIG. 11 is an enlarged view illustrating a B portion of FIG. 9.

FIGS. 9 and 10 are views for describing a display device according to a third embodiment of the present invention including a different position of the plurality of gate control signal pad parts GCPP, and FIG. 11 is an enlarged view illustrating a B portion of FIG. 9.

As seen in FIGS. 9 and 11, in a display device 30 according to the third embodiment of the present invention, a display panel 110 is configured identically to the display panel 110 of FIGS. 5 to 8, except that a plurality of gate control signal pad parts GCPP are disposed between the plurality of above-described gate pad parts GPP.

Specifically, each of the plurality of gate control signal pad parts GCPP is disposed in an inactive area between adjacent gate pad parts GPP disposed in the left and right inactive areas IA of the first substrate 112. For example, when first to fifth gate pad parts including the first gate pad part connected to a first gate line are disposed in the first substrate 112, the gate control signal pad part GCPP is disposed in an inactive area between the first and second gate pad parts, and, although not shown, the gate control signal pad part GCPP is disposed in an inactive area between the fourth and fifth gate pad parts. Each of the plurality of gate control signal pad parts GCPP, as described above, includes a plurality of gate control signal supply pads, each of which is connected to a gate control signal input pad GCIP of each of vertically adjacent gate pad parts GPP through a gate control signal link line GCLL.

The gate control signal, supplied from the gate control signal supplier 130 to the gate control signal pad part GCPP, is supplied to the gate driving IC 144 through the gate control signal supply pad, the gate control signal link line GCLL, the gate control signal input pad of the gate pad part GPP, and the gate flexible circuit film 142. The gate control signal supplied to the gate flexible circuit film 142 is supplied to the gate control signal output pad and gate control signal transfer line GTLL of the gate pad part GPP through an internal line provided in the gate flexible circuit film 142, and then supplied to a next gate driving IC 144 through a gate control signal input pad of a next gate pad part GPP and a next gate flexible circuit film 142. Therefore, the gate driving IC 144 generates the gate pulse on the basis of the gate control signal supplied to the gate control signal pad part GCPP, and sequentially supplies the gate pulse to a plurality of gate lines GL.

The gate control signal supplier 130 is adhered to the gate control signal pad part GCPP by the same scheme as FIG. 8, and connected to the first connector 155 of the PCB 150 which is disposed in the front direction of the second substrate 114. Here, the gate control signal supplier 130 may be provided in an L-shape.

In the display device 30 according to the third embodiment of the present invention, the plurality of gate control signal pad parts GCPP are disposed in an inactive area IA between vertically adjacent gate pad parts GPP, and therefore, as described above, a space of each corner portion of the first substrate 112 can be more secured within a range in which the data link lines DLL are disposed in a symmetrical structure, thus more increasing the first curvature of the first rounding portion RP1 of the first substrate 112.

Figure 12:
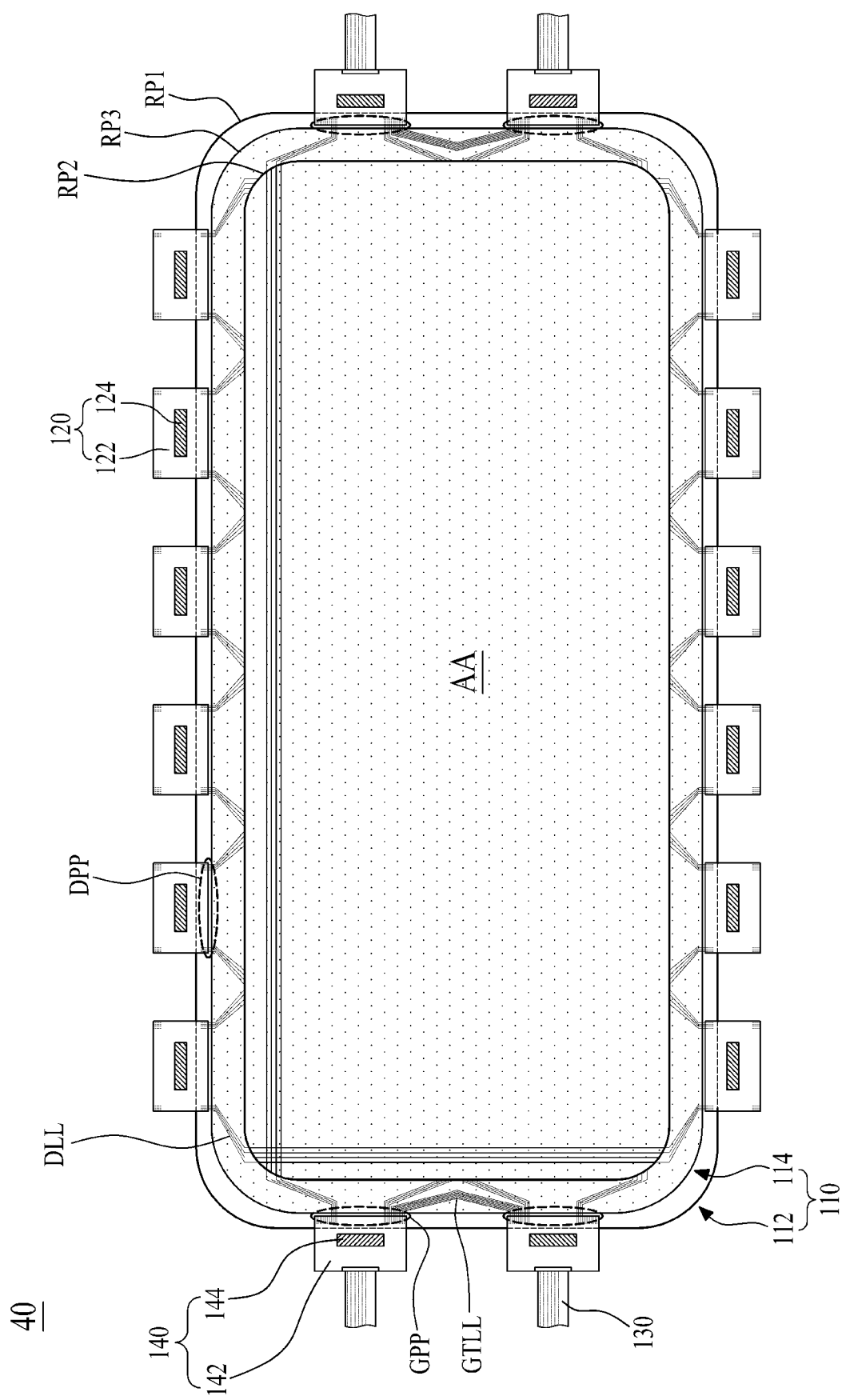
FIGS. 12 and 13 are views for describing a display device according to a fourth embodiment of the present invention.
Figure 13:
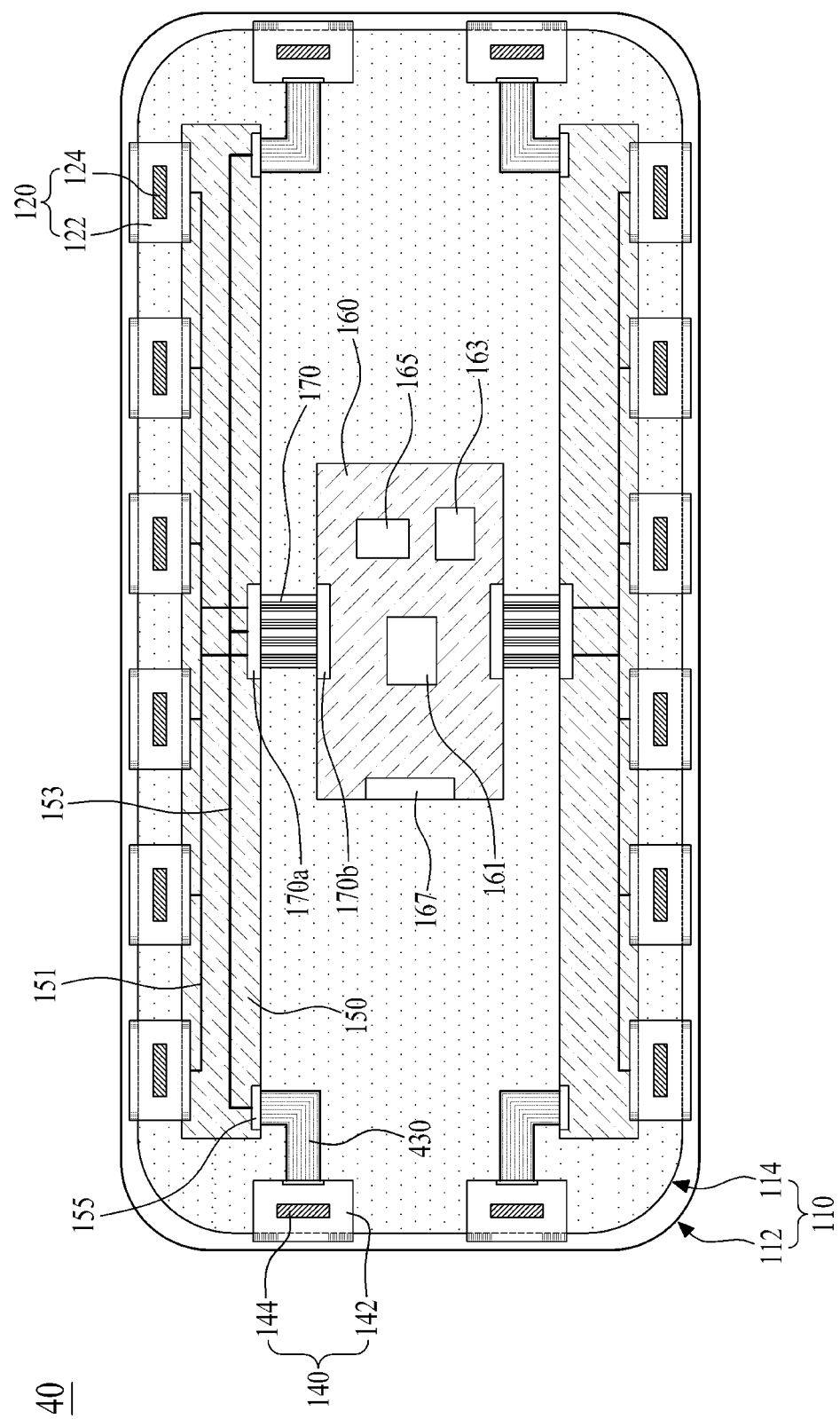
Figure 14:
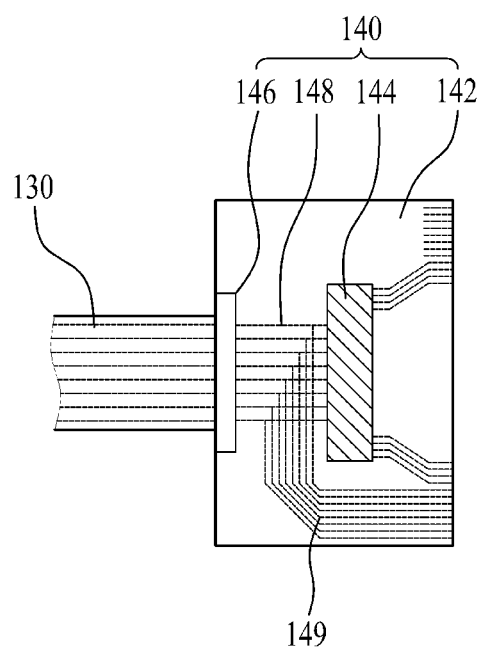
FIG. 14 is an enlarged view illustrating a gate driver of FIGS. 12 and 13.

FIGS. 12 and 13 are views for describing a display device according to a fourth embodiment of the present invention, and FIG. 14 is an enlarged view illustrating a gate driver of FIGS. 12 and 13. In comparison to FIGS. 2-11, where the plurality of gate control signal pad parts GCPP are positioned in the first substrate 112, in FIGS. 12 to 14, the plurality of gate control signal pad parts GCPP are not disposed in the first substrate 112, and the gate controls signal supplier 130 is directly connected to the gate driver 140.

As seen in FIGS. 12 to 14, in a display device 40 according to the fourth embodiment of the present invention, each of the gate drivers 140 of the plurality of gate drivers 140 respectively connected to the first and last gate lines includes a gate flexible circuit film 142, a gate driving IC 144, and a control signal input connector 146.

The gate flexible circuit film 142, as described above, is adhered to a gate pad part GPP by the TAB process, and the gate driving IC 144 is mounted on the gate flexible circuit film 142.

The control signal input connector 146 is mounted on the gate flexible circuit film 142, is connected to the gate control signal supplier 130, and transfers the gate control signal, supplied from the gate control signal supplier 130, to the gate driving IC 144. To this end, a gate control signal transfer line 148 for transferring a signal between the control signal input connector 146 and the gate driving IC 144 is disposed in the gate flexible circuit film 142. Also, the gate control signal transfer line 148 is connected to a plurality of gate control signal output pads, disposed in the gate pad part GPP, through a gate control signal output line 149 provided in the gate flexible circuit film 142.

In the plurality of gate drivers 140, the gate drivers 140 other than the gate drivers 140 respectively connected to the first and last gate lines are the same as the gate driver of FIG. 3 or FIG. 5.

The gate control signal supplier 130 is an assistant flexible circuit film provided in an L-shape, and connected to the control signal input connector 146 and the first connector 155 of the PCB 150. Therefore, the gate control signal generated by the timing controller 161 is supplied to the gate driving IC 144 through the signal transfer member 170, the PCB 150, the gate control signal supplier 130, and the gate flexible circuit film 142.

In the display device 40 according to the fourth embodiment of the present invention, some of the plurality of gate flexible circuit films 142 should be provided in different shapes to reduce electromagnetic interference. However, when the display panel 110 has an ultra high definition of 3840×2160 or more, a space between vertically adjacent gate pad parts GPP becomes progressively narrower, and for this reason, the above-described gate control signal pad part GCPP may be positioned other than at one side of the gate pad part GPP or between vertically adjacent gate pad parts GPP. For example, in the display device 40 according to the fourth embodiment of the present invention, when the display panel 110 has an ultra high definition, the gate control signal may be preferably supplied to the gate driving IC 144, but is not limited thereto.

Figure 15:
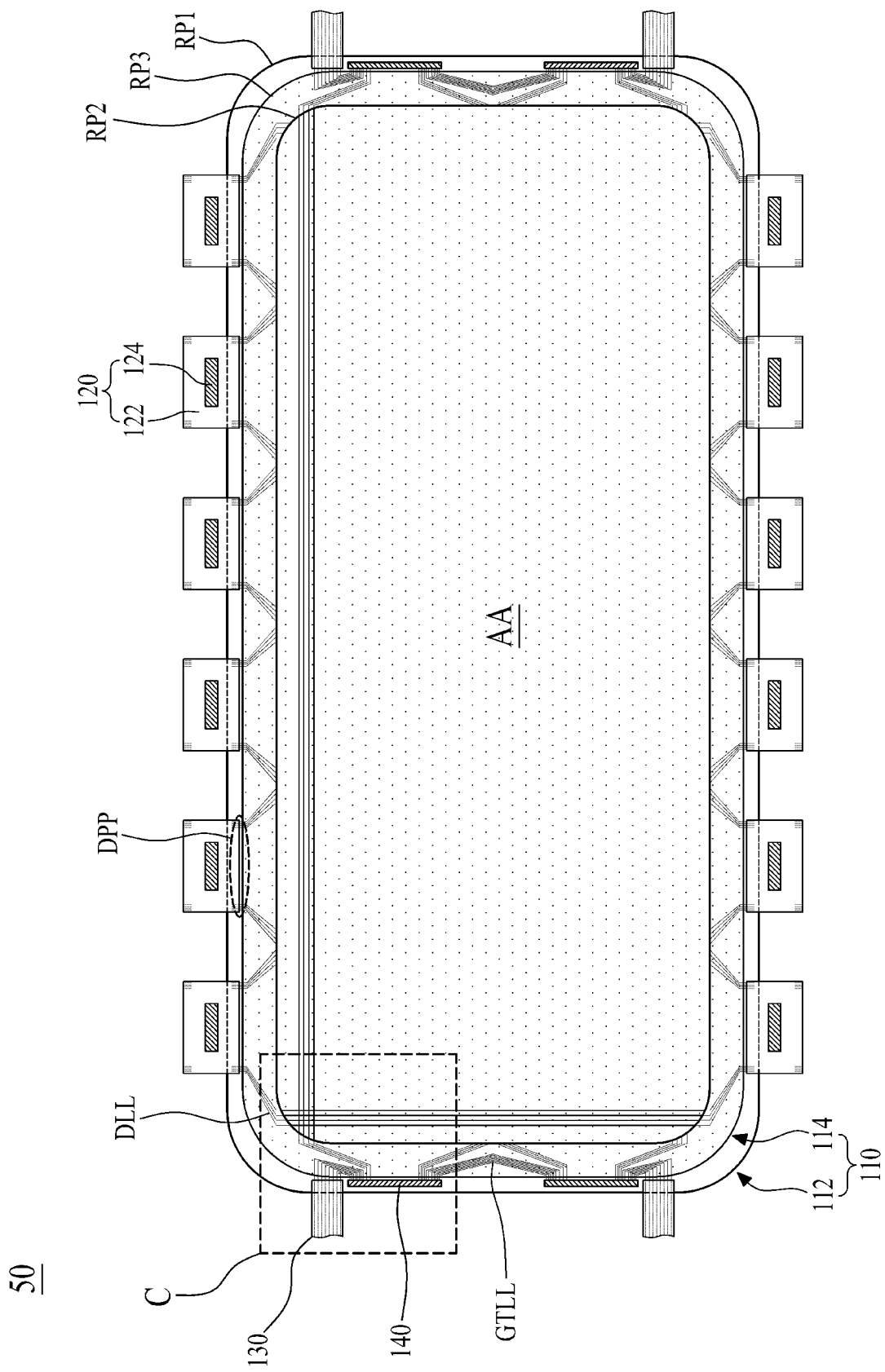
FIG. 15 is a view for describing a display device according to a fifth embodiment of the present invention.
Figure 16:
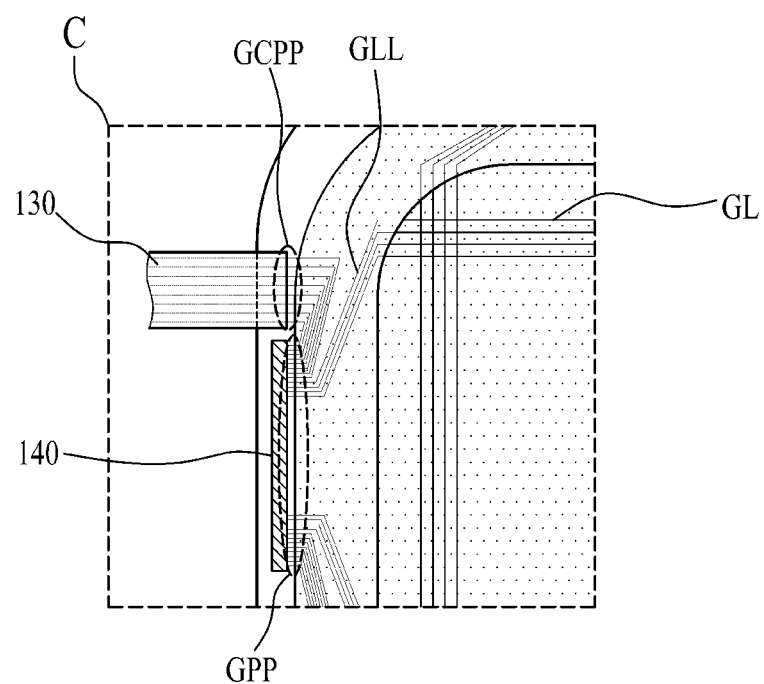
FIG. 16 is an enlarged view illustrating a C portion of FIG. 15.

FIG. 15 is a view for describing a display device according to a fifth embodiment of the present invention including a different configuration for the gate driver, and FIG. 16 is an enlarged view illustrating a C portion of FIG. 15.

As seen in FIGS. 15 and 16, in a display device 50 according to the fifth embodiment of the present invention, each of the plurality of gate drivers 140 is configured with only the above-described gate driving IC, and is not mounted on a gate flexible circuit film 142 but is directly mounted on a display panel 110 (i.e., a gate pad part GPP disposed in the first substrate 112) in a chip on glass (COG) type.

The gate driving IC of each of the plurality of gate drivers 140 mounted on the first substrate 112 is connected to a plurality of gate pads of the gate pad part GPP, a plurality of gate control signal input pads, and a plurality of gate control signal output pads. Each of the gate driving ICs, as described above, receives the gate control signal from the gate control signal supplier 130 through a gate control signal pad part GCPP and the plurality of gate control signal input pads. Therefore, each gate driving IC sequentially generates the gate pulse according to the gate control signal, and sequentially supplies the gate pulse to a plurality of gate lines GL through respective gate link lines GLL.

Each gate driving IC outputs the gate control signal, supplied through the plurality of gate control signal input pads, to the plurality of gate control signal output pads, and allows the gate control signal to be supplied to a next gate driving IC. In this case, the gate control signal may be supplied to the next gate driving IC through a separate gate control signal transfer line which is provided to pass by a gat driving IC.

In the display device 50 according to the fifth embodiment of the present invention, since the gate driving IC of the gate driver 140 is directly mounted on the gate pad part GPP of the first substrate 112, the gate flexible circuit film is not needed, thus saving the cost.

Figure 17:
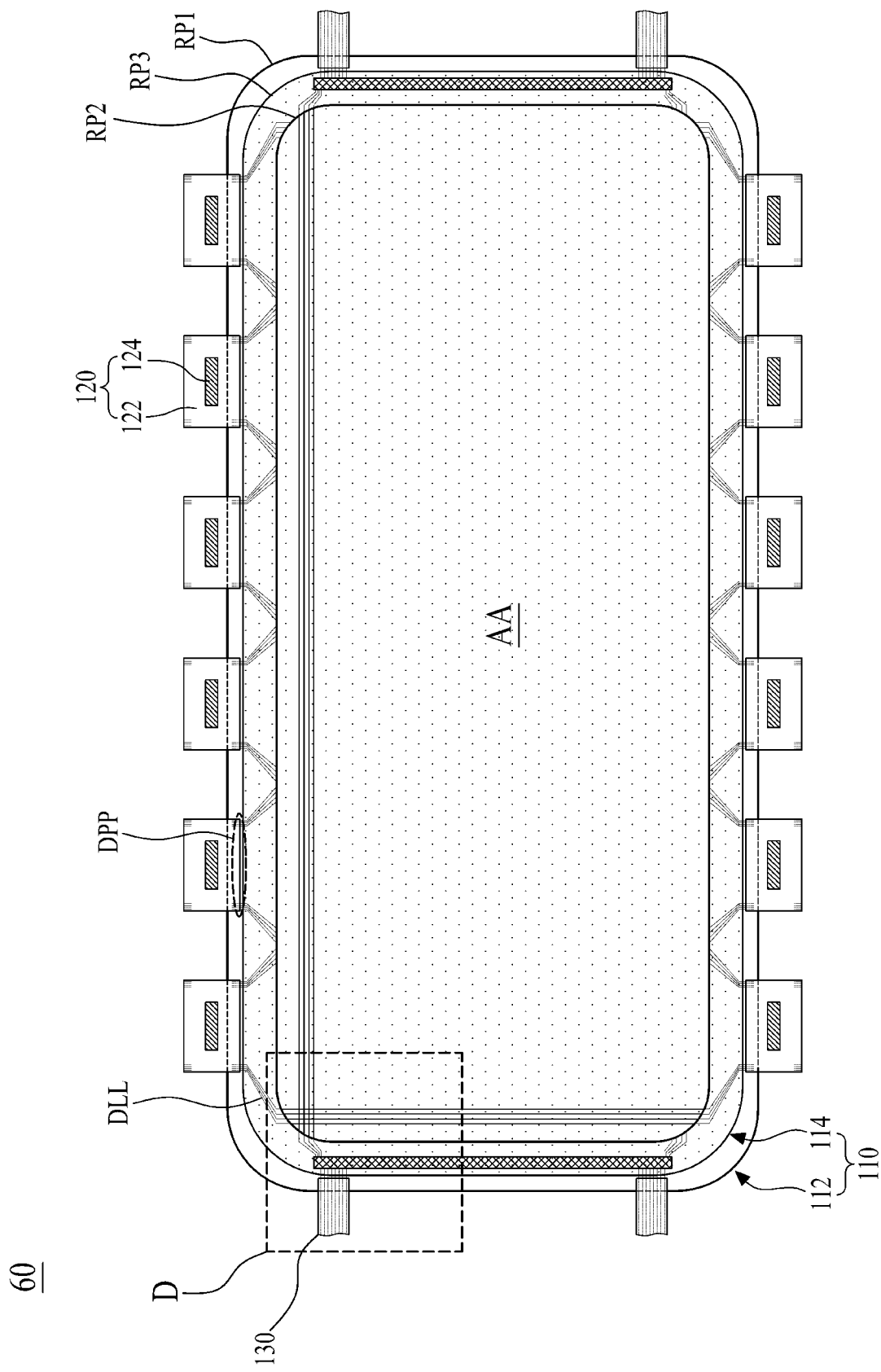
FIG. 17 is a view for describing a display device according to a sixth embodiment of the present invention.
Figure 18:
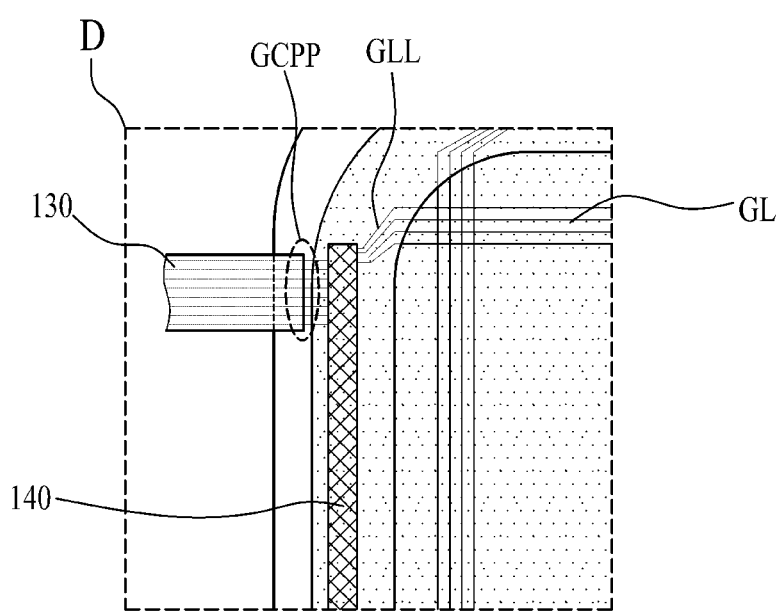
FIG. 18 is an enlarged view illustrating a D portion of FIG. 17.

FIG. 17 is a view for describing a display device according to a sixth embodiment of the present invention including a different configuration for the gate driver, and FIG. 18 is an enlarged view illustrating a D portion of FIG. 17.

As seen in FIGS. 17 and 18, in a display device 60 according to the sixth embodiment of the present invention, the gate driver 140 is disposed in the display panel 110 (i.e., left and right inactive areas of the first substrate 112) in a gate in panel (GIP) type simultaneously with a process of fog ming a TFT of each pixel. Therefore, in display device 60 according to the sixth embodiment of the present invention, the plurality of above-described gate pad parts may not be provided.

The gate driver 140 is connected to the above-described gate control signal pad part GCPP, and connected to a plurality of gate lines through respective gate link lines GLL. The gate driver 140 sequentially generates the gate pulse according to the gate control signal supplied from the gate control signal supplier 130 through the gate control signal pad part GCPP, and sequentially supplies the gate pulse to the plurality of gate lines GL through the respective gate link lines GLL. The gate driver 140 may be configured with a shift register for supplying the gate pulse to the plurality of gate lines GL, and may overlap a sealing member that adheres the first substrate 112 to the second substrate 114.

In the display device 60 according to the sixth embodiment of the present invention, since the gate driver 140 is disposed in the first substrate 112 by a process of manufacturing the TFTs, the gate flexible circuit film and the gate driving IC are not needed, thus saving the cost. Moreover, the area of each of the left and right inactive areas of the first substrate 112 is reduced, and thus a bezel width can also decrease.

In the above description of the display device according to the embodiments of the present invention, the display panel 110 has been assumed as an organic light emitting display panel, but may also be identically applied to a liquid crystal display panel.

As described above, the display device according to the present invention has a more improved aesthetic design due to the rounding portions which are formed at the corner portions of each of the active area of the display panel and the outer case. Therefore, in the display device according to the present invention, the gate control signal supplier supplying the gate control signal to the gate driver is disposed at the left side and/or right side of the display panel, a length deviation of data link lines is minimized, thus preventing an image quality from being degraded due to a deviation of data signals.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
   a first substrate including a first rounding portion and an active area including data lines, gate lines and a plurality of pixels for displaying an image,
   wherein the active area of the first substrate includes a second rounding portion;
   a second substrate including a third rounding portion;
   at least one data driver on a first edge of the first substrate;
   a plurality of data pad parts disposed on the first edge of the first substrate and connected to the at least one data driver;
   at least one gate driver on a second edge of the first substrate;
   a plurality of gate pad parts disposed on the second edge of the first substrate and connected to the at least one gate driver;
   a gate control signal pad part on the second edge of the first substrate; and
   a flexible gate control signal supplier circuit film directly coupled to the gate control signal pad part, wherein the flexible gate control signal supplier circuit film supplies a gate control signal to the gate control signal pad part,
   wherein:
   the first rounding portion having a first curvature is formed at each of corner portions of the first substrate,
   the second rounding portion having a second curvature is formed at each of corner portions of the active area of the first substrate and the first substrate overlaps with the plurality of data pad parts, the plurality of gate pad parts, the gate control signal pad part and the flexible gate control signal supplier circuit film,
   the third rounding portion having a third curvature is formed at each of corner portions of the second substrate and the second substrate overlaps with the active area without covering the plurality of data pad parts, the plurality of gate pad parts, the gate control signal pad part and the flexible gate control signal supplier circuit film, and
   the third rounding portion at each corner portion is disposed between the corresponding first and second rounding portions and is spaced apart from the corresponding first and second rounding portions, and the plurality of data pad parts, the plurality of gate pad parts and the gate control signal pad part are disposed outside of the second and third rounding portions and inside of the first rounding portion,
   wherein the flexible gate control signal supplier circuit film is bent around an edge of the second substrate and overlaps with both the third rounding portion and the second rounding portion without overlapping with the first rounding portion, and the flexible gate control signal supplier circuit film does not extend past an outermost edge of the first substrate, and
   wherein a wire-free area is located between the first rounding portion and the second rounding portion and the wire-free area excludes any wires electrically connected to the gate lines and excludes any wires electrically connected to the data lines.

2. The display device of claim 1, wherein the flexible gate control signal supplier circuit film is directly physically coupled to the second edge of the first substrate.

3. The display device of claim 1, wherein the flexible gate control signal supplier circuit film is electrically connected to a gate driving integrated circuit (IC) in the at least one gate driver via a gate control signal transfer line.

4. The display device of claim 1,
   wherein the at least one data driver is configured to convert input pixel data into data signals according to a data control signal to supply the data signals to respective pixels in the active area, and
   wherein the at least one gate driver is configured to generate a gate pulse according to the gate control signal to supply the gate pulse to the pixels.

5. The display device of claim 1, further comprising an inactive area,
   wherein:
   the active area further comprises the data lines, the gate lines formed to intersect in the active area, the data lines and the gate lines being connected to the plurality of pixels;
   at least one data pad part of the plurality of data pad parts comprises at least one data pad disposed in the inactive area, the at least one data pad part being connected to the at least one data driver, and the at least one data pad part being connected to a plurality of corresponding data lines; and
   at least one gate pad part of the plurality of gate pad parts comprises at least one gate pad disposed in the inactive area, and at least one gate control signal input pad configured to receive the gate control signal, the at least one gate pad part being connected to a plurality of corresponding gate lines, and the at least one gate pad part being connected to the at least one gate driver.

6. The display device of claim 5, wherein the at least one gate driver is configured to generate a gate pulse according to the gate control signal to supply the gate pulse to the pixels, and
   wherein the at least one gate driver comprises:
   a gate flexible circuit film adhered to the at least one gate pad part; and
   a gate driving integrated circuit (IC) mounted on the gate flexible circuit film, the gate driving IC being configured to generate the gate pulse according to the gate control signal which is supplied through the at least one gate control signal input pad.

7. The display device of claim 6, wherein the at least one gate driver is a plurality of gate drivers, the plurality of gate drivers comprising a plurality of gate flexible circuit films, respectively,
   the display device further comprising:

a printed circuit board (PCB) connected to the plurality of data drivers and the plurality of gate flexible circuit films, wherein each of the plurality of gate flexible circuit films is adhered to a corresponding gate control signal pad part, and connected to a connector on which the PCB is mounted.

8. The display device of claim 7, wherein each of the plurality of gate flexible circuit films is bent without protruding from the corresponding gate control signal pad part to outside a side surface of the first substrate.

9. The display device of claim 1, further comprising:
an outer case overlapping with the first and third rounding portions without covering the second rounding portion.

10. The display device of claim 1, wherein at least one gate driver includes two adjacent gate drivers on the second edge of the first substrate, and
wherein a portion of the flexible gate control signal supplier circuit film is disposed between the two adjacent gate drivers on the second edge of the first substrate.

11. A display device comprising:
a first substrate including a first rounding portion, an active area including a second rounding portion, and an inactive area disposed outside the active area;
a plurality of data pad parts disposed on a first edge of the first substrate;
a plurality of gate pad parts disposed on a second edge of the first substrate;
the inactive area comprising data lines which are connected to data drivers via the plurality of data pad parts, and gate lines which are connected to gate drivers via the plurality of gate pad parts, and
the active area comprising pixels which are connected to the data lines and the gate lines;
a second substrate coupled to the first substrate via a sealing member for protecting organic light elements of the pixels, wherein the second substrate includes a third rounding portion;
a gate control signal pad part on the second edge of the first substrate;
a first flexible gate control signal supplier circuit film directly coupled to the gate control signal pad part, wherein the first flexible gate control signal supplier circuit film supplies a gate control signal to the gate control signal pad part; and
an outer case enclosing the first substrate and the second substrate,
wherein:
the first rounding portion having a first curvature is formed at each of corner portions of the first substrate,
the second rounding portion having a second curvature is formed at each of corner portions of the active area of the first substrate and the first substrate overlaps with the plurality of data pad parts, the plurality of gate pad parts, the gate control signal pad part and the first flexible gate control signal supplier circuit film,
the third rounding portion having a third curvature is formed at each of corner portions of the second substrate and the second substrate overlaps with the active area without covering the plurality of data pad parts, the plurality of gate pad parts, the gate control signal pad part and the first flexible gate control signal supplier circuit film, and
the third rounding portion at each corner portion is disposed between the corresponding first and second rounding portions and is spaced apart from the corresponding first and second rounding portions, and the plurality of data pad parts, the plurality of gate pad parts and the gate control signal pad part are disposed outside of the second and third rounding portions and inside of the first rounding portion, wherein the first flexible gate control signal supplier circuit film is bent around an edge of the second substrate and overlaps with both the third rounding portion and the second rounding portion without overlapping with the first rounding portion, and the first flexible gate control signal supplier circuit film does not extend past an outermost edge of the first substrate, and wherein a wire-free area is located between the first rounding portion and the second rounding portion and the wire-free area excludes any wires electrically connected to the gate lines and excludes any wires electrically connected to the data lines.

12. The display device of claim 11, wherein the data drivers are on the first edge of the first substrate,
wherein the gate drivers are on the second edge of the first substrate,
the display device further comprising a second flexible gate control signal supplier circuit film coupled to the second edge of the first substrate, and electrically connected to at least one of the gate drivers, and
wherein the second flexible gate control signal supplier circuit film is directly physically coupled to the second edge of the first substrate.

13. The display device of claim 12, wherein the data drivers are configured to convert input pixel data into data signals according to a data control signal to supply the data signals to respective pixels in the active area, and
wherein at least one gate driver is configured to generate a gate pulse according to the gate control signal to supply the gate pulse to the pixels.

14. The display device of claim 11, wherein the first flexible gate control signal supplier circuit film is electrically connected to a gate driving integrated circuit (IC) in at least one gate driver via a gate control signal transfer line.

15. The display device of claim 11, wherein the data drivers are on the first edge of the first substrate,
wherein the gate drivers are on the second edge of the first substrate,
wherein the data lines and the gate lines are formed to intersect in the active area, and
wherein:
at least one data pad part of the plurality of data pad parts comprises at least one data pad disposed in the inactive area, the at least one data pad part being connected to at least one of the data drivers, and the at least one data pad part being connected to a plurality of corresponding data lines; and
at least one gate pad part of the plurality of gate pad parts comprises at least one gate pad disposed in the inactive area, and at least one gate control signal input pad configured to receive the gate control signal, the at least one gate pad part being connected to a plurality of corresponding gate lines, and the at least one gate pad part being connected to at least one of the gate drivers.

16. The display device of claim 15, wherein at least one of the gate drivers is configured to generate a gate pulse according to the gate control signal to supply the gate pulse to the pixels, and
wherein the at least one gate driver comprises:
a gate flexible circuit film adhered to the at least one gate pad part; and a gate driving integrated circuit (IC) mounted on the gate flexible circuit film, the gate driving IC being configured to generate the gate pulse according to the gate control signal which is supplied through the at least one gate control signal input pad.

17. The display device of claim 16, wherein all of the gate drivers comprise gate flexible circuit films, respectively, the display device further comprising:

a printed circuit board (PCB) connected to the data drivers and the gate flexible circuit films, wherein each of the gate flexible circuit films is adhered to a corresponding gate control signal pad part, and connected to a connector on which the PCB is mounted.

18. The display device of claim 17, wherein each of the gate flexible circuit films is bent without protruding from the corresponding gate control signal pad part to outside a side surface of the first substrate.

19. The display device of claim 11, wherein the outer case overlaps with the first and third rounding portions without covering the second rounding portion.

* * * * *